United States Patent [19]
Ohi

[11] Patent Number: 5,162,673
[45] Date of Patent: Nov. 10, 1992

[54] BI-CMOS LOGIC CIRCUIT

[75] Inventor: Susumu Ohi, Tokyo, Japan

[73] Assignee: NEC Corporation, Tokyo, Japan

[21] Appl. No.: 759,466

[22] Filed: Sep. 13, 1991

[30] Foreign Application Priority Data

Sep. 14, 1990 [JP] Japan .................. 2-245500

[51] Int. Cl.[5] .................. H03K 19/02; H03K 19/08
[52] U.S. Cl. .................. 307/446; 307/451; 307/455; 307/570
[58] Field of Search .......... 307/475, 450, 446, 455, 307/451, 570, 270

[56] References Cited

U.S. PATENT DOCUMENTS

| | | | |
|---|---|---|---|
| 4,558,234 | 12/1985 | Suzuki et al. | 307/446 |
| 4,791,320 | 12/1988 | Kawata et al. | 307/446 |
| 4,798,983 | 1/1989 | Mori | 307/446 |
| 4,882,534 | 11/1989 | Koshizuka | 307/451 |
| 5,113,096 | 5/1992 | Lev et al. | 307/570 |

Primary Examiner—Edward P. Westin
Assistant Examiner—Richard Roseen
Attorney, Agent, or Firm—Laff, Whitesel, Conte & Saret

[57] ABSTRACT

A Bi-CMOS circuit includes a bipolar transistor, a first-conductive-type MOSFET, and first and second second-conductive-type MOSFETs. The bipolar transistor is connected at a base to an input terminal to which an input potential is applied and at an emitter to an output terminal at which an output potential is obtained. The bipolar transistor and the second MOSFET are connected serially. The second MOSFET becomes ON to discharge the output terminal only if the input potential is low level, so that the power consumption of the Bi-CMOS circuit is reduced.

7 Claims, 6 Drawing Sheets

BI-CMOS LOGIC CIRCUIT

FIELD OF THE INVENTION

This invention relates to a Bi-CMOS circuit, and more particularly to, a power saved Bi-CMOS circuit including an emitter follower circuit or a wired OR circuit.

BACKGROUND OF THE INVENTION

A conventional emitter follower circuit includes first and second NPN transistors. The first NPN transistor for emitter follower is connected at a base to an input terminal to which an input potential $V_{IN}$ is applied, at a collector to a first power supply $V_{CC}$, and at an emitter to an output terminal at which an output potential $V_{OUT}$ is obtained. The second NPN transistor is connected at a collector to the output terminal and at an emitter to a second power supply $V_{EE}$, and is clamped at a base to a constant potential $V_S$ to make a constant current $I_S$ flow through the second NPN transistor.

In operation, when a high level potential is applied to the base of the first NPN transistor through the input terminal, a current larger than the constant current $I_S$ flows through the first NPN transistor to increase the output potential $V_{OUT}$. The output potential $V_{OUT}$ is clamped to a level, that is, a level lower than the input potential $V_{IN}$ by approximately a forward voltage $V_F$ between the base and the emitter of the first NPN transistor, so that an emitter current of the first NPN transistor and the constant current $I_S$ are balanced. When a low level potential is applied to the base of the first NPN transistor through the input terminal, the second NPN transistor decreases the output potential $V_{OUT}$. The output potential $V_{OUT}$ is clamped to a level, that is, a level lower than the input potential $V_{IN}$ by approximately a forward voltage $V_F$ between the base and the emitter of the first NPN transistor, so that an emitter current of the first NPN transistor and the constant current $I_S$ are balanced.

A conventional wired OR logic circuit includes first to third NPN transistors. The first NPN transistor is connected at a base to a first input terminal to which a first input potential $V_{IN1}$ is applied, at a collector to a first power supply $V_{CC}$, and at an emitter to an output terminal. The second NPN transistor is connected at a base to a second input terminal to which a second input potential $V_{IN2}$ is applied, at collector to the first power supply $V_{CC}$, and at an emitter to the output terminal. The third NPN transistor is connected at a collector to the output terminal and at an emitter to a second power supply $V_{EE}$, and is clamped at a base to a constant voltage $V_S$ to make a constant current $I_S$ flow through the third NPN transistor.

In operation, when both or either of the first and second input potentials $V_{IN1}$ and $V_{IN2}$ are high level, both or either of the first and second NPN transistors which are applied at the base with a high level increases the output potential $V_{OUT}$ to be a level lower than the high input level by the forward voltage $V_F$ between the base and the emitter thereof. When both the first and second input potentials $V_{IN1}$ and $V_{IN2}$ are low level, the output potential $V_{OUT}$ is decreased to be a level lower than the low input level by the forward voltage $V_F$.

According to the conventional emitter follower and wired OR logic circuits, however, there is a disadvantage in that the stand-by current is large, because the constant current flows continually through the second NPN transistor independently of the level of the input potential. The large stand-by current causes increase of the power consumption of the circuit. Additionally, such a large stand-by current decreases the merit in a Bi-CMOS circuit which has an advantage of low power consumption.

Further, a speed of increasing the output potential results in slow level, because the pull-down NPN transistor make the constant current flow even in a transit state where the pull-up NPN transistor is increasing the level of the output potential. Increase of the pull-down speed of the output potential causes increase of the constant current.

SUMMARY OF THE INVENTION

Accordingly, it is an object of the invention to provide a Bi-CMOS circuit in which power consumption is reduced at a stand-by state and operation speed of pull-up of an output is increased.

According to a feature of the invention, a Bi-CMOS circuit comprises:

a bipolar transistor which is connected at a base to an input terminal to which an input signal is applied, at a collector to a first power supply, and at an emitter to an output terminal at which an output signal is obtained;

a MOSFET of a first-conductive-type which is connected at a gate to the input terminal, at a source to the first power supply, and at a drain to a nodal point;

a first MOSFET of a second-conductive-type which is connected at a gate and a drain to the nodal point and at a source to a second power supply; and a second MOSFET of a second-conductive-type which is connected at a gate to the nodal point, at a source to the second power supply, and at a drain to the output terminal.

BRIEF DESCRIPTION OF THE DRAWINGS

The invention will be explained in more detail in conjunction with appended drawings wherein.

DESCRIPTION OF THE PREFERRED EMBODIMENTS

Before describing a Bi-CMOS circuit in preferred embodiments according to the invention, the conventional emitter follower circuit and the conventional wired OR logic circuit described before will be explained in conjunction with FIGS. 1 to 4.

Figure 1:
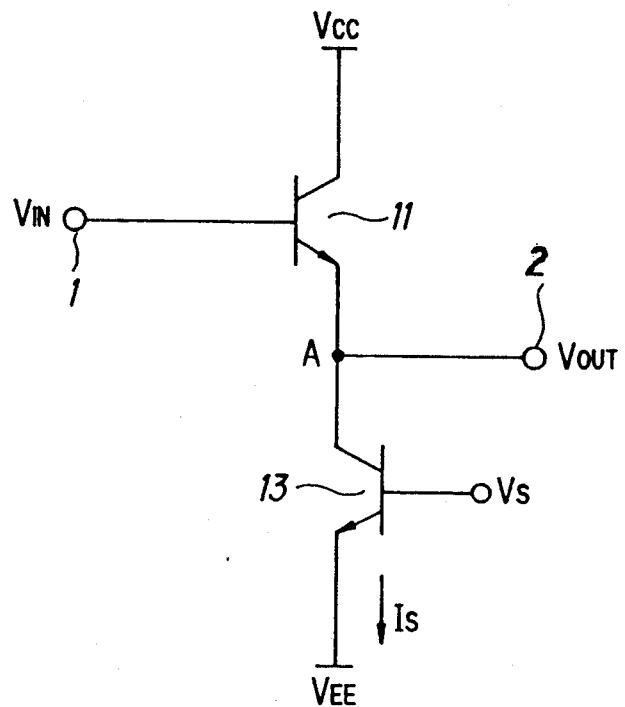
FIG. 1 is a circuitry diagram of a conventional emitter follower circuit.
Figure 2:
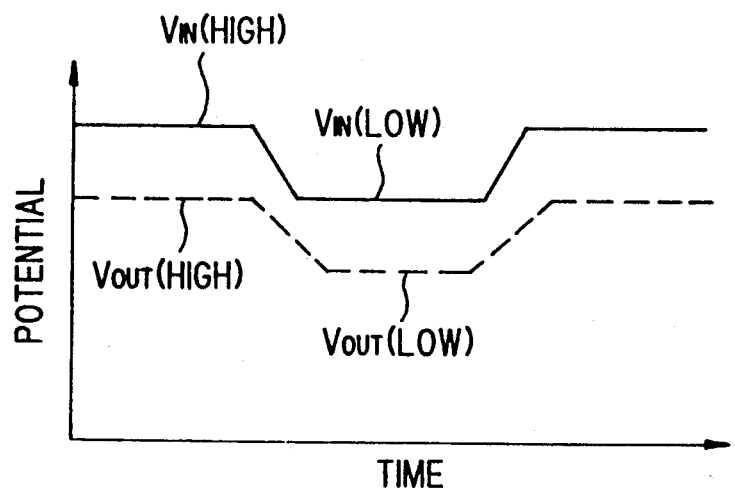
FIG. 2 is a timing chart showing operation of the conventional emitter follower circuit.

FIG. 1 shows a conventional emitter follower circuit. The emitter follower circuit includes first and second NPN transistors 11 and 13 which are connected as explained before. When the input potential $V_{IN}$ of high level is applied to the input terminal 1 connected to the base of first NPN transistor 11, the output potential $V_{OUT}$ of high level is obtained at the output terminal 2 connected to a nodal point A between the emitter of the first NPN transistor 11 and the collector of the second NPN transistor 13, as shown in FIG. 2. The difference between the input and output potentials $V_{IN}$ and $V_{OUT}$ is based on the forward voltage $V_F$ between the base and emitter of the first NPN transistor 11. Similarly, when the input potential $V_{IN}$ of low level is applied to the input terminal 1, the output potential $V_{OUT}$ of low level is obtained at the output terminal 2, as also shown in FIG. 2. Under these states, the constant current $I_S$ flows through the second NPN transistor 13 connected at the base to the constant potential $V_S$.

Figure 3:
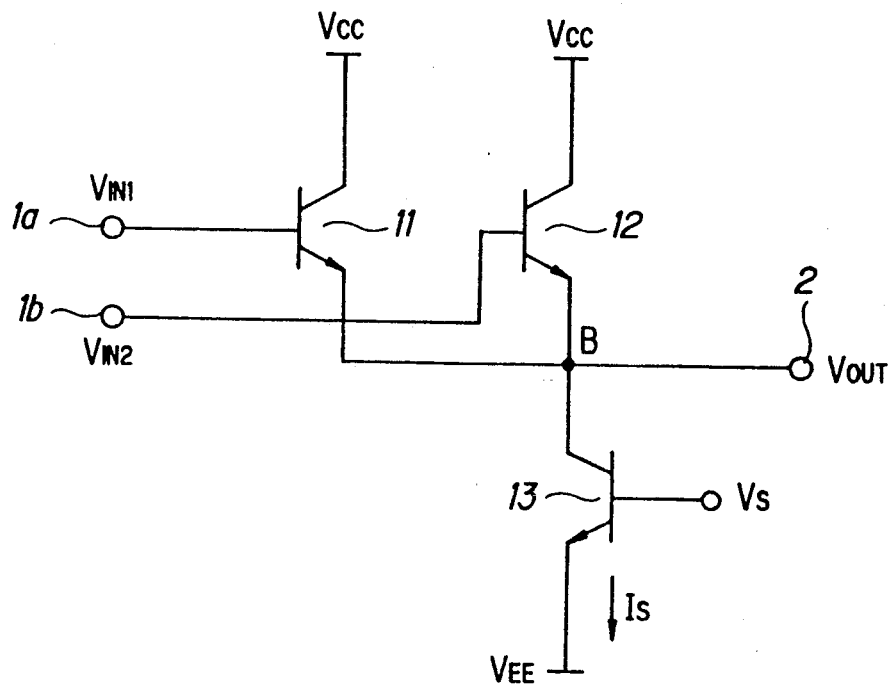
FIG. 3 is a circuitry diagram of a conventional wired OR logic circuit.

FIG. 3 shows a conventional wired OR logic circuit having two inputs. The wired OR logic circuit includes first to third NPN transistors 11 to 13 which are connected as explained before. In this wired OR logic circuit, first and second input potentials $V_{IN1}$ and $V_{IN2}$ are applied to the input terminals 1a and 1b connected to the first and second NPN transistors 11 and 12, respectively, and the output potential $V_{OUT}$ is obtained at the output terminal 2 connected to the nodal point B between the second and third NPN transistors 12 and 13.

Figure 4:
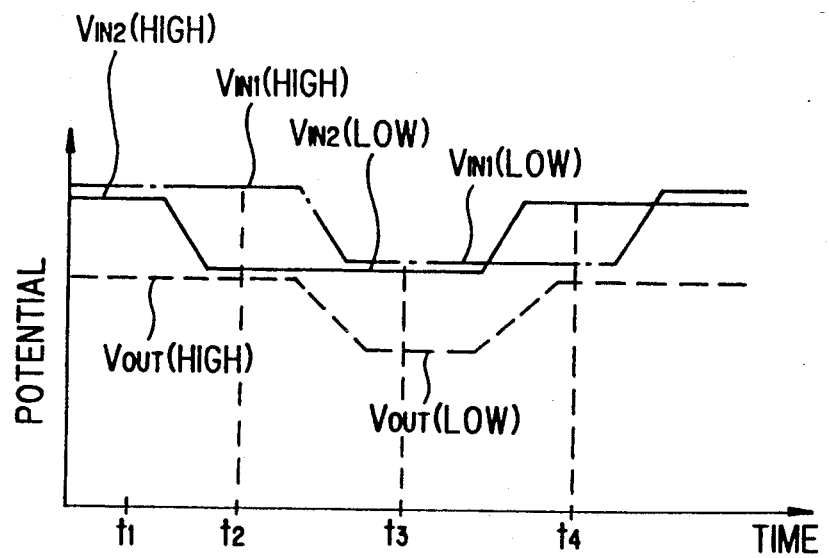
FIG. 4 is a timing chart showing operation of the conventional wired OR logic circuit.

In operation, the following truth table is obtained as shown in FIG. 4.

| TIME | $V_{IN1}$ | $V_{IN2}$ | $V_{OUT}$ |
| --- | --- | --- | --- |
| $t_1$ | HIGH | HIGH | HIGH |
| $t_2$ | HIGH | LOW | HIGH |
| $t_3$ | LOW | LOW | LOW |
| $t_4$ | LOW | HIGH | HIGH |

In this operation, the constant current $I_S$ flows through the third NPN transistor 13 connected at the base to the constant potential $V_S$.

Next, a Bi-CMOS circuit in preferred embodiments according to the invention will be explained in conjunction with FIGS. 5 to 11.

Figure 5:
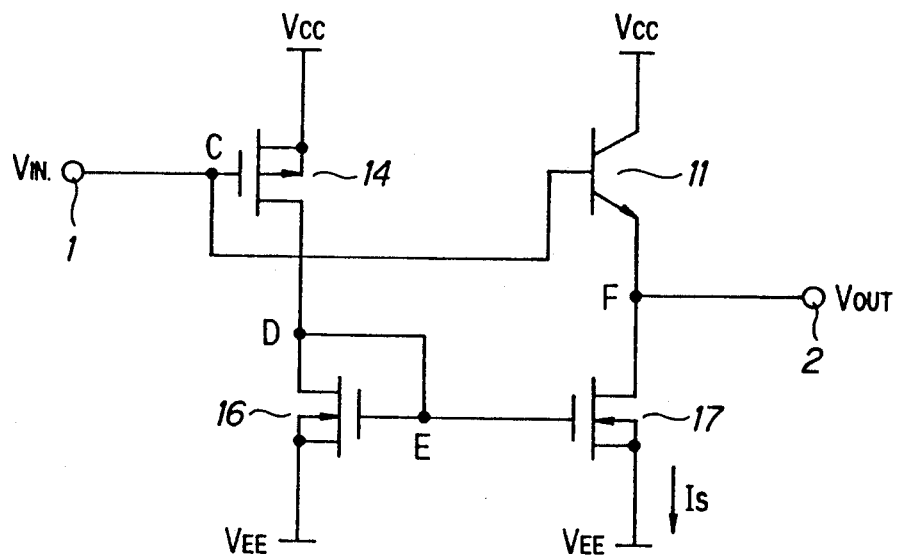
FIG. 5 is a circuitry diagram of an emitter follower circuit of a Bi-CMOS circuit in a first preferred embodiment according to the invention.

FIG. 5 shows an emitter follower circuit in a first preferred embodiment according to the invention.

The emitter follower circuit includes an NPN transistor 11, a P-MOSFET 14, and first and second N-MOSFETs 16 and 17. The NPN transistor 11 is connected at a base to a nodal point C which is connected to an input terminal 1 to which an input potential $V_{IN}$ is applied, at a collector to a first power supply $V_{CC}$, and at an emitter to a nodal point F which is connected to an output terminal at which an output potential $V_{OUT}$ is obtained. The P-MOSFET 14 is connected at a gate to the nodal point C, at a source to the first power supply $V_{CC}$, and at a drain to a nodal point. The first N-MOSFET 16 is connected at a gate to a nodal point E which is connected to the nodal point D, at a source to a second power supply $V_{EE}$, and at a drain to the nodal point D.

The second N-MOSFET 17 is connected at a gate to the nodal point E, at a source to the second power supply $V_{EE}$, and at a drain to the nodal point F.

Figure 6:
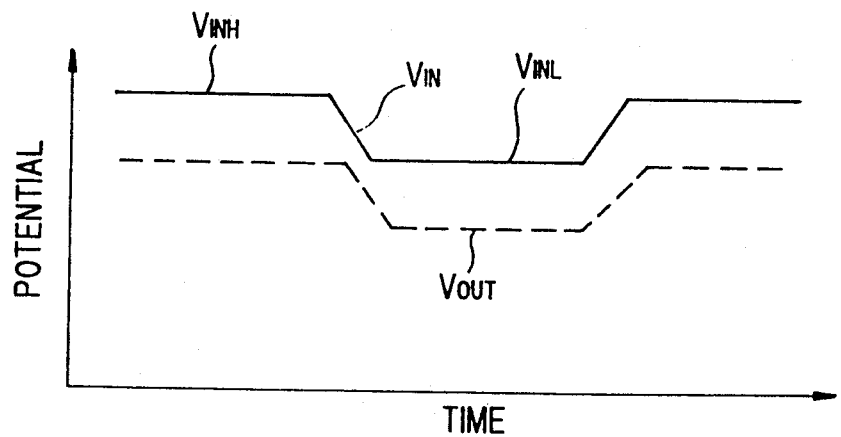
FIGS. 6 and 7 are timing charts showing operation of the emitter follower circuit of the Bi-CMOS circuit in the first preferred embodiment according to the invention.
Figure 7:
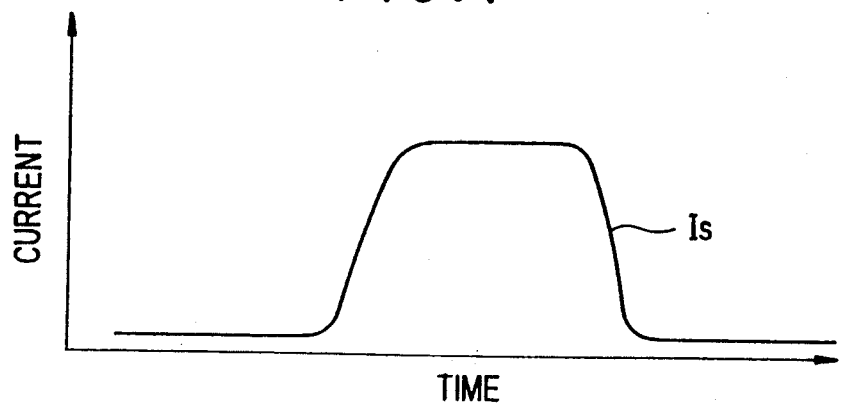

In operation, when the input potential $V_{IN}$ is high level $V_{INH}$ equal to a potential of the first power supply $V_{CC}$, as shown in FIG. 6, the P-MOSFET 14 becomes OFF, so that the first and second N-MOSFETs 16 and 17 become also OFF. On the other hand, the NPN transistor 11 becomes ON, so that the output terminal 2 is charged to be a potential lower than the high input potential $V_{INH}$ by the forward voltage $V_F$ between the base and the emitter of the NPN transistor 11 to make the output potential $V_{OUT}$ high level. In such a state, there flows no current to the second power supply, as shown in FIG. 7, because the second N-MOSFET 17 is in OFF state. Thus, only charging current flows for charging the output terminal 2 in the circuit, so that there is no waste of current.

When the input potential $V_{IN}$ is low level $V_{INL}$ lower than a threshold level of the P-MOSFET 14, as also shown in FIG. 6, the P-MOSFET 14 becomes ON, so that the potential level of the nodal point E becomes high level to make the first N-MOSFET 16 ON and a current flows therethrough. The second N-MOSFET 17 becomes also ON to provide a constant current $I_S$, as shown in FIG. 7, after becoming state of the base potential level higher than a threshold level thereof. Consequently, the output terminal 2 is discharged through the second N-MOSFET 17, so that the output potential $V_{OUT}$ becomes a potential level lower than the low input potential $V_{INL}$ by the forward voltage $V_F$ of the base and the emitter of the NPN transistor 11.

In order to increase the changing speed of the output potential $V_{OUT}$ from high level to low level, a relatively large current should flow through the second N-MOSFET 17. That is realized by determining a threshold voltage of the second N-MOSFET 17 lower than that of the first N-MOSFET 16. This make another advantage of low power consumption, because a relatively small current flows through the P-MOSFET 14 and the first N-MOSFET 16.

Thus, the Bi-CMOS circuit can carry out the same operation as in the conventional circuit with a half of the power consumption in compared with the conventional circuit.

Figure 8:
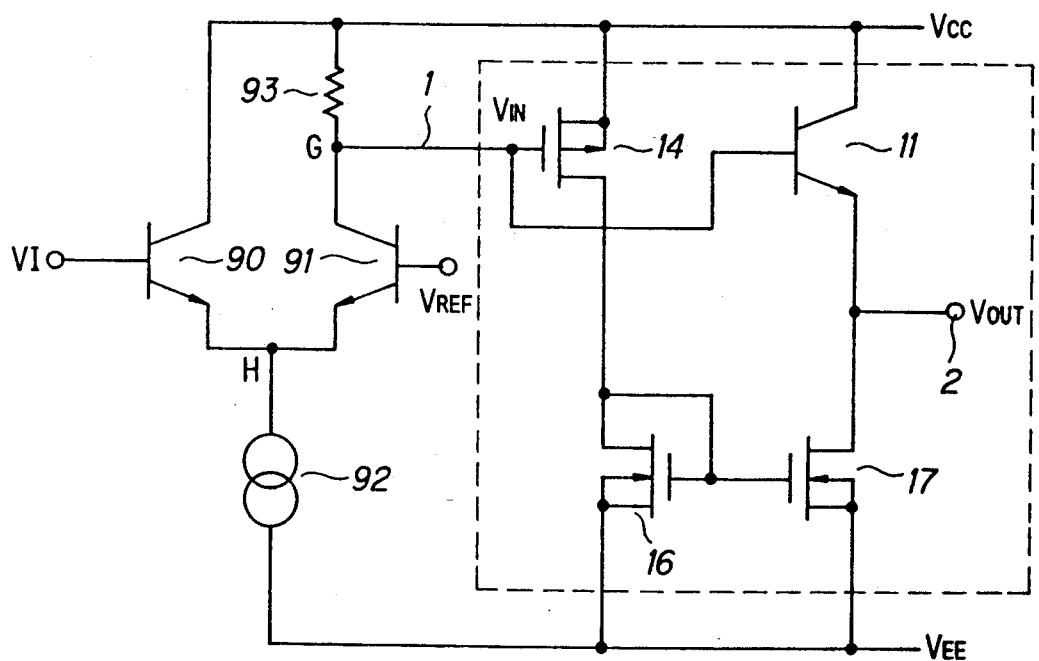
FIG. 8 is a circuitry diagram of the emitter follower circuit connected with an ECL circuit.

The emitter follower circuit in the first preferred embodiment may be connected with an output of a current switch of an ECL circuit, as shown in FIG. 8. The current switch of the ECL circuit includes two NPN transistors 90 and 91, a constant current source 92 and a resistance 93. The NPN transistor 90 is connected at a base to an input terminal to which an input potential VI is applied, at a collector to a first power supply $V_{CC}$, and at an emitter to a nodal point H. The NPN transistor 91 is connected at a base to a reference terminal to which a reference potential $V_{REF}$ is applied, at a collector to a nodal point G which is connected to an input of the emitter follower circuit 20, and at an emitter to the nodal point H. The resistance 93 is connected between the first power supply $V_{CC}$ and the nodal point G. The constant current source 92 is connected between the nodal point H and the second power supply $V_{EE}$. Threshold voltages of the MOSFETs 14, 16 and 17 are set to be 0.3 V, 0.7 V and 0.5 V, respectively.

In operation, when the input potential VI is higher than the reference potential $V_{REF}$, an output potential of the current switch becomes equal to a potential of the first power supply $V_{CC}$ to be applied to the base of the P-MOSFET 14 of the emitter follower circuit 20 as an input potential $V_{IN}$, so than an output potential $V_{OUT}$ of the emitter follower circuit 20 becomes a potential level ($V_{CC}-V_F$) as a high level in ECL level.

When the input potential VI is lower than the reference potential $V_{REF}$, there occurs a voltage drop between two terminals of the resistance 93 determined by a value of the resistance 93 and a current of the constant current source 92, so that the input potential $V_{IN}$ becomes low level which is lower than the first power supply $V_{CC}$ by 0.8 to 1.2 V to make the output potential $V_{OUT}$ low level as the ECL level.

Figure 9:
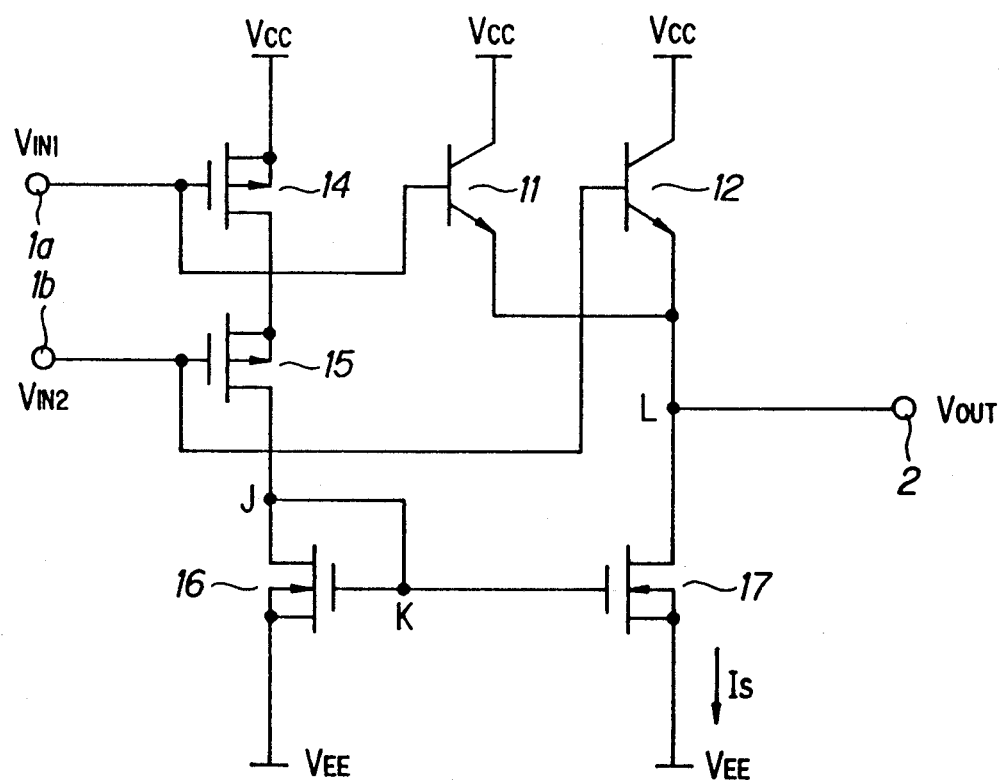
FIG. 9 is a circuitry diagram of a wired OR logic circuit of a Bi-CMOS circuit in a second preferred embodiment according to the invention.

FIG. 9 shows a wired OR logic circuit in a second preferred embodiment according to the invention. The wired OR logic circuit includes first and second NPN transistors 11 and 12, first and second P-MOSFETs 14 and 15, and first and second N-MOSFETs 16 and 17. The first and second NPN transistors 11 and 12 are connected at bases to first and second input terminals 1a and 1b respectively to which first and second input potentials $V_{IN1}$ and $V_{IN2}$ are respectively applied, at collectors to a first power supply $V_{CC}$, and at emitter to a nodal point L which is connected to an output terminal 2 at which an output potential $V_{OUT}$ is obtained. The first P-MOSFET 14 is connected at a gate to the first input terminal 1a, at a source to the first power supply $V_{CC}$, and at a drain to a source of the second P-MOSFET 15. The second P-MOSFET 15 is connected at a gate to the second input terminal 1b, at the source to the drain of the first P-MOSFET 14, and at a drain to nodal point J. The first N-MOSFET 16 is connected at a gate to a nodal point K which is connected to the nodal point J, at a source to a second power supply $V_{EE}$, and at a drain to the nodal point J. The second N-MOSFET 17 is connected at a gate to the nodal point K, at a source to the second power supply $V_{EE}$, and at a drain to the nodal point L.

Figure 10:
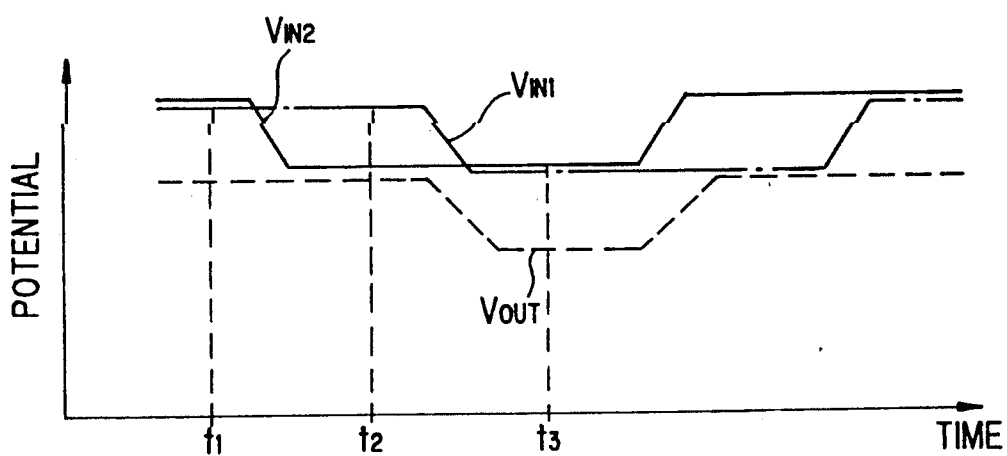
FIGS. 10 and 11 are timing charts showing operation of the wired OR logic circuit of the Bi-CMOS circuit in the second preferred embodiment according to the invention.
Figure 11:
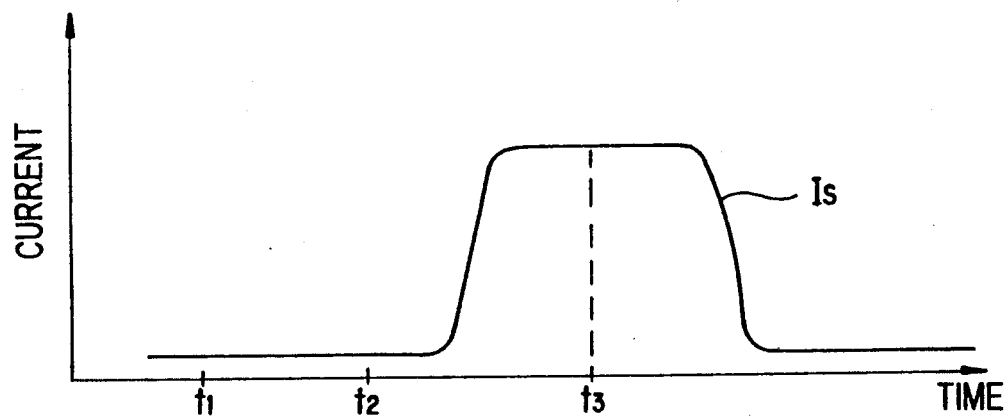

In operation, when both or either of the first and second input potentials $V_{IN1}$ and $V_{IN2}$ are high level equal to the first power supply $V_{CC}$, both or either of the first and second P-MOSFETs 14 and 15 become OFF, so that the first and second N-MOSFETs 16 and 17 become also OFF. On the other hand, both or either of the first and second NPN transistors 11 and 12 become ON, so that the output terminal 2 is charged to be a high level potential. This is shown in FIG. 10 by the times $t_1$ and $t_2$. In such a state, there flows no current to the second power supply, because the second N-MOSFET 17 is in OFF state. Thus, only charging current flows for charging the output terminal 2 in the circuit, so that there is no waste of current, as shown in FIG. 11.

When both the first and second input potentials $V_{IN1}$ and $V_{IN2}$ are low level lower than threshold levels of the first and second P-MOSFETs 14 and 15, the first and second P-MOSFETs 14 and 15 become ON, so that the potential level of the nodal point K becomes high level to make the first N-MOSFET 16 ON and a current flows therethrough. The second N-MOSFET 17 becomes also ON after becoming state of the base potential level higher than a threshold level thereof. Consequently, the output terminal 2 is discharged through the second N-MOSFET 17, so that the output potential $V_{OUT}$ becomes a low potential level, as shown in FIGS. 10 and 11 by the time $t_3$.

Although the invention has been described with respect to specific embodiment for complete and clear disclosure, the appended claims are not to thus limited and alternative constructions that may occur to one skilled in the art which fairly fall within the basic teaching herein set forth.

What is claimed is:

1. A Bi-CMOS circuit, comprising:
  a bipolar transistor which is connected at a base to an input terminal to which an input signal is applied, at a collector to a first power supply, and at an emitter to an output terminal at which an output signal is obtained;
  a MOSFET of a first-conductive-type which is connected at a gate to said input terminal, at a source to said first power supply, and at a drain to a nodal point;
  a first MOSFET of a second-conductive-type which is connected at a gate and a drain to said nodal point and at a source to a second power supply; and
  a second MOSFET of a second-conductive-type which is connected at a gate to said nodal point, at a source to said second power supply, and at a drain to said output terminal.

2. A Bi-CMOS circuit, according to claim 1:
  wherein said bipolar transistor is an NPN bipolar transistor, said first-conductive-type MOSFET is a P-MOSFET, and said first and second second-conductive-type MOSFETs are N-MOSFETs.

3. A Bi-CMOS circuit, comprising:
  a plurality (N) of bipolar transistors connected in parallel, each of said bipolar transistors being connected at a base to each corresponding input terminal of a plurality (N) of input terminals, at a collector to a first power supply, and at an emitter to an output terminal;
  a plurality (N) of first-conductive-type MOSFETs connected serially, each of said first-conductive-type MOSFETs being connected at a gate to said corresponding input terminal of said plurality (N) of input terminals, a first MOSFET of said plurality (N) of said first-conductive-type MOSFETs being connected at a source to said first power supply, and a last MOSFET of said plurality (N) of said first-conductive-type MOSFETs being connected at a drain to a nodal point;
  a first MOSFET of a second-conductive-type which is connected at a gate and a drain to said nodal point and at a source to a second power supply; and
  a second MOSFET of a second-conductive-type which is connected at a gate to said nodal point, at a source to said second power supply, and at a drain to said output terminal.

4. A Bi-CMOS circuit, according to claim 3:
  wherein said plurality (N) of said bipolar transistors are a plurality (N) of NPN bipolar transistors, said plurality (N) of said first-conductive-type MOSFETs are a plurality (N) of P-MOSFETs and said first and second second-conductive-type MOSFETs are N-MOSFET.

5. A Bi-CMOS circuit, comprising:
  a bipolar transistor having a collector-emitter path coupled between a first power supply terminal and an output terminal;
  a first MOS transistor of a first conductive type having a drain-source path coupled between said output terminal and a second power supply terminal;
  a second MOS transistor of a second conductive type having a source-drain path coupled between said first power supply terminal and a circuit node;

A third MOS transistor of said first conductive type having a drain-source path coupled between said second power supply terminal and said circuit node;

means for connecting said circuit mode to gates of said first and third MOS transistors; and means for applying an input signal in common to a base of said bipolar transistor and a gate of said second MOS transistor.

6. A Bi-CMOS circuit, according to claim 5:
wherein said first MOS transistor has a first threshold voltage and said third MOS transistor has a second threshold voltage larger than said first threshold voltage.

7. A Bi-CMOS circuit, according to claim 5, further comprising:

a second bipolar transistor having a collector-emitter path coupled between said first power supply terminal and said output terminal;

a fourth MOS transistor of said second conduction type having a source-drain path coupled in series to said source-drain path of said second MOS transistor between said first power supply terminal and said circuit node; and means for applying an second input signal in common to a base of said second bipolar transistor and a gate of said fourth MOS transistor.

* * * * *